(12) United States Patent
Feudel et al.

(10) Patent No.: US 8,288,256 B2
(45) Date of Patent: Oct. 16, 2012

(54) ENHANCING TRANSISTOR CHARACTERISTICS BY A LATE DEEP IMPLANTATION IN COMBINATION WITH A DIFFUSION-FREE ANNEAL PROCESS

(75) Inventors: Thomas Feudel, Radebeul (DE); Rolf Stephan, Dresden (DE); Manfred Horstmann, Duerrroehrsdorf-Dittersbach (DE)

(73) Assignee: Advanced Micro Devices, Inc., Austin, TX (US)

( * ) Notice: Subject to any disclaimer, the term of this patent is extended or adjusted under 35 U.S.C. 154(b) by 649 days.

(21) Appl. No.: 12/023,743

(22) Filed: Jan. 31, 2008

(65) Prior Publication Data
US 2008/0268625 A1  Oct. 30, 2008

(30) Foreign Application Priority Data
Apr. 30, 2007  (DE) .......................... 10 2007 020 260

(51) Int. Cl.
*H01L 21/425* (2006.01)
(52) U.S. Cl. ............... 438/527; 438/914; 257/E21.624; 257/E21.638
(58) Field of Classification Search .................. 438/527, 438/529; 257/E21.624, E21.638
See application file for complete search history.

(56) References Cited

U.S. PATENT DOCUMENTS

| 5,474,940 | A | | 12/1995 | Tsukamoto ...................... 437/19 |
| 5,719,424 | A | * | 2/1998 | Ahmad et al. ................. 257/336 |
| 6,096,628 | A | * | 8/2000 | Greenlaw et al. ............. 438/530 |
| 6,479,350 | B1 | * | 11/2002 | Ling et al. ..................... 438/265 |
| 6,486,513 | B1 | * | 11/2002 | Matsumoto et al. .......... 257/347 |
| 6,660,601 | B2 | | 12/2003 | Miyata et al. ................. 438/301 |
| 6,660,605 | B1 | * | 12/2003 | Liu ................................ 438/307 |
| 6,881,641 | B2 | * | 4/2005 | Wieczorek et al. ........... 438/358 |
| 2003/0146458 | A1 | * | 8/2003 | Horiuchi et al. .............. 257/288 |
| 2004/0219755 | A1 | * | 11/2004 | Rabkin et al. ................. 438/299 |
| 2004/0259302 | A1 | * | 12/2004 | Ito et al. ........................ 438/231 |
| 2006/0088969 | A1 | * | 4/2006 | Jain ............................... 438/305 |
| 2007/0232039 | A1 | * | 10/2007 | Kubo et al. ................... 438/527 |

FOREIGN PATENT DOCUMENTS
WO  WO 2005/062353 A1  7/2005

OTHER PUBLICATIONS
Foreign associate transmittal letter dated Jan. 21, 2008.
Translation of Official Communication issued Dec. 4, 2007.

* cited by examiner

*Primary Examiner* — Leonard Chang
(74) *Attorney, Agent, or Firm* — Williams, Morgan & Amerson, P.C.

(57) ABSTRACT

By combining an anneal process for adjusting the effective channel length and a substantially diffusion-free anneal process performed after a deep drain and source implantation, the vertical extension of the drain and source region may be increased substantially without affecting the previously adjusted channel length. In this manner, in SOI devices, the drain and source regions may extend down to the buried insulating layer, thereby reducing the parasitic capacitance, while the degree of dopant activation and thus series resistance in the extension regions may be improved. Furthermore, less critical process parameters during the anneal process for adjusting the channel length may provide the potential for reducing the lateral dimensions of the transistor devices.

17 Claims, 6 Drawing Sheets

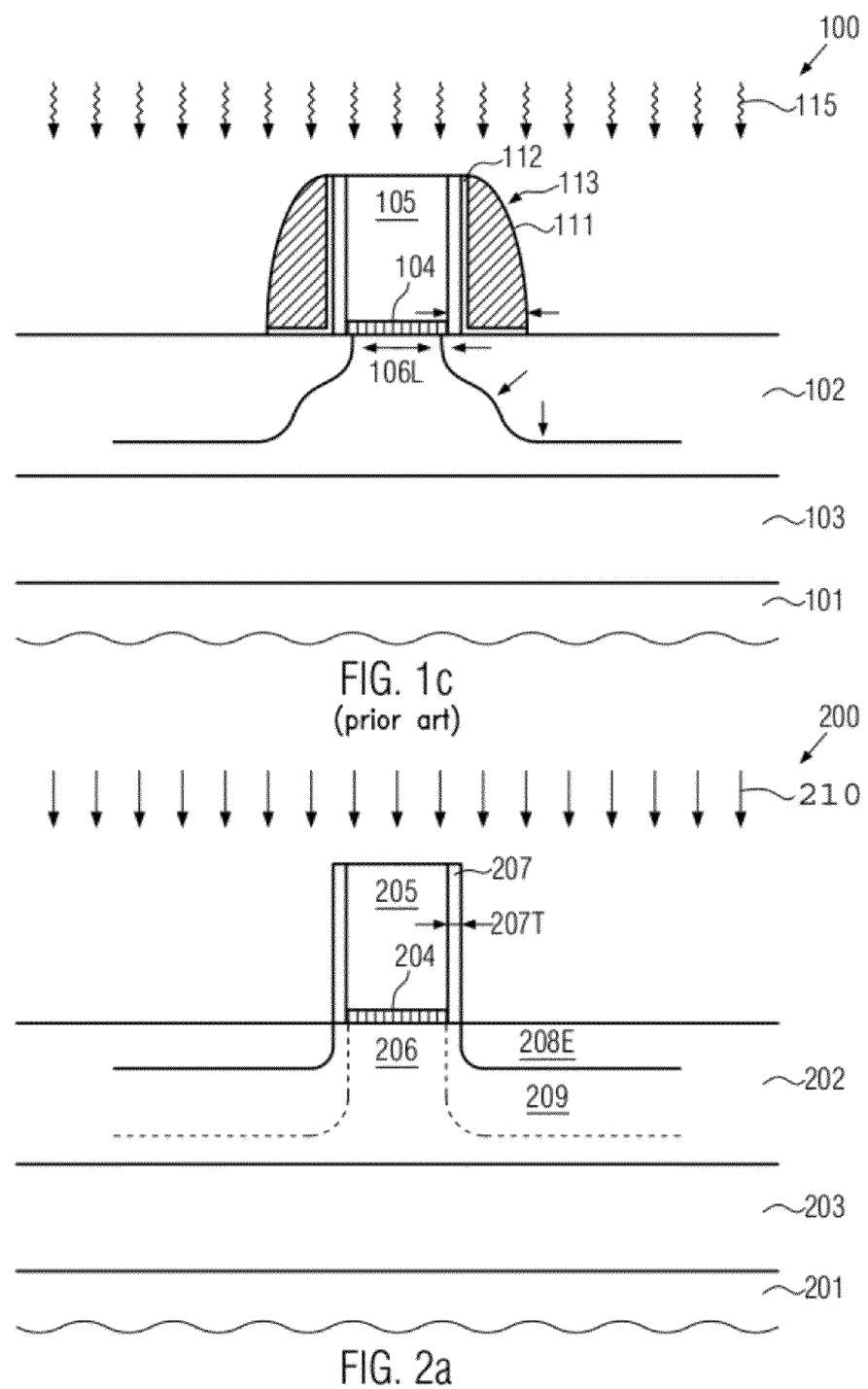

ENHANCING TRANSISTOR CHARACTERISTICS BY A LATE DEEP IMPLANTATION IN COMBINATION WITH A DIFFUSION-FREE ANNEAL PROCESS

BACKGROUND OF THE INVENTION

1. Field of the Invention

The present disclosure generally relates to the fabrication of integrated circuits, and, more particularly, to the fabrication of highly sophisticated field effect transistors, such as MOS transistor structures in SOI configuration, requiring highly doped shallow junctions and reduced series resistance.

2. Description of the Related Art

The manufacturing process for integrated circuits continues to improve in several ways, driven by the ongoing efforts to scale down the feature sizes of the individual circuit elements. Presently, and in the foreseeable future, the majority of integrated circuits are, and will be, based on silicon devices, due to the high availability of silicon substrates and due to the well-established process technology that has been developed over the past decades. A key issue in developing integrated circuits of increased packing density and enhanced performance is the scaling of transistor elements, such as MOS transistor elements, to provide the great number of transistor elements that may be necessary for producing modern CPUs and memory devices. One important aspect in manufacturing field effect transistors having reduced dimensions is the reduction of the length of the gate electrode that controls the formation of a conductive channel separating the source and drain regions of the transistor. The source and drain regions of the transistor element are conductive semiconductor regions including dopants of an inverse conductivity type compared to the dopants in the surrounding crystalline active region, e.g., a substrate or a well region.

Although the reduction of the gate length is necessary for obtaining smaller and faster transistor elements, it turns out, however, that a plurality of issues are additionally involved to maintain proper transistor performance for a reduced gate length. One challenging task in this respect is the provision of shallow junction regions, at least at the area in the vicinity of the channel region, i.e., source and drain extension regions, which nevertheless exhibit a high conductivity to minimize the resistivity in conducting charge carriers from the channel to a respective contact area of the drain and source regions. The requirement for shallow junctions having a high conductivity is commonly met by performing an ion implantation sequence to obtain a high dopant concentration having a profile that varies laterally and in depth. The introduction of a high dose of dopants into a crystalline substrate area, however, generates heavy damage in the crystal structure, and therefore one or more anneal cycles are typically required for activating the dopants, i.e., for placing the dopants at crystal sites, and to cure the heavy crystal damage. However, the electrically effective dopant concentration is limited by the ability of the anneal cycles to electrically activate the dopants. This ability in turn is limited by the solid solubility of the dopants in the silicon crystal and the temperature and duration of the anneal process that are compatible with the process requirements. Moreover, besides the dopant activation and the curing of crystal damage, dopant diffusion may also occur during the annealing, which may lead to a "blurring" of the dopant profile, which may be advantageous for defining critical transistor properties, such as the overlap between the extension regions and the gate electrode. In other areas of the drain and source regions, that is, in deeper lying portions, the diffusion may result in a reduction of the dopant concentration at the corresponding PN junction areas, thereby reducing the conductivity at the vicinity of theses areas.

Thus, on the one hand, a high anneal temperature may be desirable in view of a high degree of dopant activation, re-crystallization of implantation-induced lattice damage and a desired diffusion at shallow areas of the extension regions, while, on the other hand, the duration of the anneal process should be short in order to restrict the degree of dopant diffusion in the deeper drain and source regions, which may reduce the dopant gradient at the respective PN junctions and also reduce the overall conductivity due to reducing the averaged dopant concentration. Furthermore, very high temperatures during the anneal process may negatively affect the gate insulation layer, thereby reducing the reliability thereof. That is, high anneal temperatures may degrade the gate insulation layer and thus may influence the dielectric characteristics thereof, which may result in increased leakage currents, reduced breakdown voltage and the like. Therefore, for highly advanced transistors, the positioning, shaping and maintaining of a desired dopant profile are important properties for defining the final performance of the device, since the overall series resistance of the conductive path between the drain and source contacts may represent a dominant part for determining the transistor performance.

Recently, advanced anneal techniques have been developed in which extremely high temperatures may be achieved at a surface portion of the substrate, thereby providing sufficient energy to the atoms for activating the dopants and re-crystallizing lattice damage, wherein, however, the duration of the treatment is short enough to substantially prevent a significant diffusion of the dopant species and other impurities contained in the carrier material. Respective advanced anneal techniques are typically performed on the basis of radiation sources that are configured to provide light of appropriate wavelength that may be efficiently absorbed in upper portions of the substrate and any components formed thereon, wherein the effective duration of the irradiation may be controlled to a desired small time interval, such as a few milliseconds and significantly less. For instance, respective flash lamp exposure sources are available which provide light of a defined wavelength range resulting in a surface-near heating of material, thereby providing the conditions for short range motions of the respective atoms in the materials provided near the surface of the carrier material. In other cases, laser radiation may be used, for instance, in the form of short laser pulses or a continuous beam that may be scanned across the substrate surface on the basis of an appropriate scan regime in order to obtain the desired short term heating at each point on the substrate. Thus, contrary to traditional rapid thermal anneal (RTA) processes, in which frequently the entire carrier material may be heated to a desired temperature, the radiation-based advanced anneal techniques cause non-equilibrium conditions wherein a high amount of power is supplied within extremely short time intervals, thereby providing the required extremely high temperatures at a very thin surface layer, while the remaining material of the substrate may remain substantially unaffected by the energy deposition during the anneal process. Thus, in advanced manufacturing regimes, traditional RTA processes may frequently be replaced by advanced radiation-based anneal processes in order to obtain a high degree of dopant activation and re-crystallization in drain and source regions while not unduly contributing to dopant diffusion, which may be advantageous in terms of a steep dopant gradient at the respective PN junctions. However, adjusting the effective channel length on the basis of a well-controlled diffusion of the dopants may be difficult to be integrated in the conventional process flow unless significant efforts may have to be made, thereby resulting in additional process complexity. On the other hand, the definition of the effective channel length on the basis of conventional well-established anneal techniques may require an increased spacer width and thus increased lateral dimensions of the transistor, when an efficient process flow is to be maintained, as will be explained in more detail with reference to FIGS. 1a-1c.

FIG. 1a schematically illustrates a cross-sectional view of a transistor device 100 in an advanced manufacturing stage. The transistor 100 may represent any type of sophisticated field effect transistor as typically used in sophisticated integrated circuits, such as microprocessors, storage chips and the like. The transistor 100 comprises a substrate 101, which may represent any appropriate carrier material for forming thereon an insulating layer 103 and an appropriate semiconductor layer 102, in and above which respective circuit components, such as the transistor 100, are to be formed. For example, the substrate 101 may represent a silicon substrate or any other appropriate material, thereby defining a silicon-on-insulator (SOI) configuration. Furthermore, a gate electrode 105, for instance comprised of polysilicon, may be formed above the semiconductor layer 102 and may be separated therefrom by a gate insulation layer 104. In this manufacturing stage, respective offset spacers 107, which may be comprised of silicon dioxide, silicon oxynitride and the like, are provided with an appropriate thickness 107T, which in turn is selected so as to define a desired offset of respective extension regions 108E defined by a corresponding dopant species of a specified conductivity type in accordance with the design of the transistor device 100. For instance, for an N-channel transistor, the extension regions 108 may comprise an N-type dopant species. Furthermore, the crystalline structure of the semiconductor layer 102 adjacent to the gate electrode 105 may be damaged or substantially amorphized, thereby defining a respective substantially amorphous region 109, which may result in enhanced isotropy during the formation of the extension regions 108 and further implantation processes, as will be described later on.

It should be appreciated that the length of a channel region 106, i.e., in FIG. 1a, the spacing between the extension regions 108E in the horizontal direction, depends on the length of the gate electrode 105 wherein the actual effective channel length may finally be determined by respective PN junctions formed by the extension regions 108E with the channel region 106. That is, the effective channel length may be adjusted by a controlled diffusion process, as previously explained, wherein the overall lateral dimensions in the transistor length direction may also be affected by this process strategy, as will be explained later on.

The transistor device 100 as shown in FIG. 1a may be formed on the basis of the following well-established processes. After providing the substrate 101 having formed thereon the buried insulating layer 103 and the semiconductor layer 102, respective isolation structures (not shown), such as shallow trench isolations (STI) and the like, may be formed to define appropriately sized active areas within the semiconductor layer 102, in which one or more circuit components may be formed, such as the transistor 100. For this purpose, sophisticated lithography, etch, deposition and planarization techniques may be used. Subsequently, the doping of the channel region 106 may be adjusted in accordance with transistor requirements. Thereafter, appropriate materials for the gate electrode 105 and the gate insulation layer 104 may be provided, for instance, by oxidation and/or deposition for the gate insulation layer 104 and by deposition of the material of the gate electrode 105, followed by advanced lithography and etch techniques in order to appropriately define the lateral dimensions of the gate electrode 105. For sophisticated applications, the gate length, which also affects the effective channel length, may be in the range of approximately 50 nm and even less for highly advanced semiconductor devices. Next, the offset spacer 107 may be formed on the basis of conformal deposition techniques and/or oxidation processes followed by an anisotropic etch process, wherein the initial layer thickness and the respective etch conditions may substantially determine the width 107T. Subsequently, an implantation process may be performed on the basis of appropriately selected parameters, such as energy and dose in order to form the substantially amorphized portion 109 down to a specific depth in the layer 102, wherein a certain amount of material of the semiconductor layer 102 may be maintained in its crystalline state, which may then act as a crystallization template in a later manufacturing stage for activating the dopants and re-crystallizing damaged areas of the semiconductor layer 102. Also, other implantation processes, such as a halo implantation, may be performed at this manufacturing stage. Furthermore, an implantation process 110 is performed to introduce the required dopant species for defining the extension regions 108E, wherein a respective offset to the gate electrode 105 may be obtained by the offset spacers 107. Since the final effective channel length, as well as the vertical extension of the respective deep drain and source regions, may have to be adjusted on the basis of an anneal process, the respective width 107T may be highly correlated to the corresponding anneal process parameters which, in turn, are related to the overall device characteristics.

For instance, the amorphized portion 109 may result in highly uniform conditions during the implantation of a respective dopant species, wherein, however, the amorphization may not extend down to the buried insulating layer 103, as previously explained. Hence, a subsequent implantation process for defining the deep drain and source regions may be substantially restricted to the amorphized portion 109, thereby requiring a corresponding adaptation of the respective diffusion activity in order to drive the resulting drain and source regions further towards the buried insulating layer 103. However, a corresponding diffusion in the depth direction is also accompanied by a corresponding diffusion in the lateral direction so that the initial offset defined by the offset spacer 107 and thus the width 107T may have to be adapted to the respective anneal parameters. Consequently, the width 107T may have to be selected greater than desirable in order to conform with the requirements of drain and source regions having an increased depth.

FIG. 1b schematically illustrates the transistor device 100 in a further advanced manufacturing stage. As shown, a further spacer element 111 may be provided to define, in combination with the offset spacer 107 and a corresponding etch stop layer 112, if provided, a spacer structure 113. The spacer structure 113 may also comprise additional individual spacer elements (not shown) depending on the respective process requirements. The spacer element 111 may be comprised of any appropriate material, such as silicon nitride, and may have a width adapted to define deep drain and source portions 108D formed by a respective implantation process 114, wherein, as previously described, respective process parameters may be selected such that the deep drain and source regions 108D, as implanted, may be defined within the portion 109, thereby providing highly uniform implantation conditions due to the reduction or avoidance of channeling effects. For driving the deep drain and source regions 108D towards the buried insulating layer 103, the corresponding lateral diffusion may also have to be accommodated by the spacer width 111W as is also previously explained with reference to the offset spacer 107. Thus, the overall width of the spacer structure 113 may be correlated with the overall configuration of the drain and source regions 108 comprising the extension region 108E and the deep drain and source region 108D, wherein the spacer width 111W and the thickness 107T may also be correlated in order to obtain a desired effective channel length after a corresponding anneal process.

FIG. 1c schematically illustrates the transistor device during a corresponding anneal process 115, which may be a conventional RTA process wherein respective process parameters, that is, the effective anneal temperature and the duration of the process, may be selected such that desired lateral and vertical profiles of the drain and source regions 108 are obtained. As indicated, if the drain and source regions 108 are to be extended substantially down to the buried insulating layer 103, moderately high anneal temperatures, in combination with relatively long process times, may be required, thereby also necessitating an increased width of the spacer structure 113 in order to obtain a desired effective channel length 106L. Consequently, for highly sophisticated applications, the required width of the spacer structure 113 may not allow further reduction of the overall length dimension of the transistor 100, when an increased depth of the drain and source regions 108 is required. On the other hand, using highly advanced anneal techniques, such as laser-based or flash lamp-based processes with extremely short anneal times, may not efficiently allow the increase of the drain and source regions 108 in the depth direction and may therefore require additional measures to obtain the desired effective channel length 106L and an increased vertical extension of the drain and source regions 108. For instance, the deep drain and source regions 108D may be formed prior to defining the extension regions 108E, wherein a respective anneal process may be performed to obtain a high diffusion activity. Thereafter, the respective extension regions may be defined by a corresponding implantation process followed by an anneal process with significantly reduced diffusion activity, as may be accomplished on the basis of the above-specified advanced anneal techniques. In this case, however, several additional process steps may be required, such as the removal of the spacers, forming additional spacer elements during the subsequent processing after defining the drain and source regions and the like. Hence, in view of the situation described above, advanced techniques may be desirable for improving the transistor characteristics while not unduly contributing to process complexity.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein is directed to a technique for enhancing the transistor performance by performing an anneal process with reduced diffusion of the dopants after the adjustment of the effective channel length, in combination with an additional implantation process to increase the extension of the respective drain and source regions along the depth direction. Thus, well-established anneal techniques, in combination with well-established implantation sequences, may be performed to define the extension regions in combination with a portion of the deep drain and source regions, wherein the corresponding spacer structure may be designed with a reduced width, since the vertical diffusion may not have to be taken into consideration, due to the subsequent incorporation of further dopant species, which may then be efficiently activated substantially without affecting the respective lateral dopant profile obtained in a previous anneal process. Consequently, the implantation processes, the respective spacer structure and the anneal process parameters may be specifically selected to obtain a desired effective channel length, thereby also providing an overall reduced lateral dimension of the respective transistor element, wherein the effective depth of the drain and source regions may be adjusted on the basis of a separate additional implantation process. In some illustrative embodiments, the drain and source regions may be formed to extend down to the buried insulating layer, when an SOI configuration is considered.

One illustrative method disclosed herein comprises performing a first implantation process to introduce a first dopant species of a first conductivity type into a semiconductor region to form a first portion of drain and source regions by using a gate electrode and a spacer structure formed on sidewalls thereof as an implantation mask. The method further comprises performing a first anneal process for activating the first dopant species. Moreover, a second implantation process is performed to introduce a second dopant species of the first conductivity type into the semiconductor region to form a deep portion of the drain and source regions while using the gate electrode and the spacer structure as an implantation mask. Finally, a second anneal process is performed for activating the first and second dopant species.

In another illustrative method disclosed herein, drain and source regions of a first transistor are defined in a semiconductor layer by performing a plurality of implantation processes for incorporating a first dopant species of a first conductivity type into the semiconductor layer by using a spacer structure formed on sidewalls of a gate electrode. The method further comprises annealing the drain and source regions of the first transistor to substantially adjust a channel length of the first transistor. Furthermore, a second dopant species of the first conductivity type is introduced into the semiconductor layer, wherein the second dopant species extends to a buried insulating layer located below the semiconductor layer. Finally, the first and second dopant species are activated while substantially maintaining the channel length of the first transistor.

Yet another illustrative method disclosed herein comprises annealing a first portion of drain and source regions of a first transistor so as to substantially adjust a first channel length. The method further comprises annealing a first portion of drain and source regions of a second transistor in order to substantially adjust a second channel length. Moreover, an implantation sequence is performed to introduce further dopant species such that the drain and source regions of the first and second transistors extend down to a buried insulating layer. Finally, at least the further dopant species is activated substantially without affecting the first and second channel lengths.

BRIEF DESCRIPTION OF THE DRAWINGS

The disclosure may be understood by reference to the following description taken in conjunction with the accompanying drawings, in which like reference numerals identify like elements, and in which:

FIGS. 1a-1c schematically illustrate cross-sectional views of a transistor device during various manufacturing stages in forming drain and source regions on the basis of a conventional process flow, wherein an effective channel length is adjusted on the basis of a diffusion process;

FIGS. 2a-2e schematically illustrate cross-sectional views of a transistor device during various manufacturing stages, wherein an effective channel length may be adjusted on the basis of an anneal process, while the effective depth of the drain and source regions may be adjusted on the basis of an additional implant step followed by an anneal process of reduced diffusion of dopants according to illustrative embodiments.

Figure 1A:
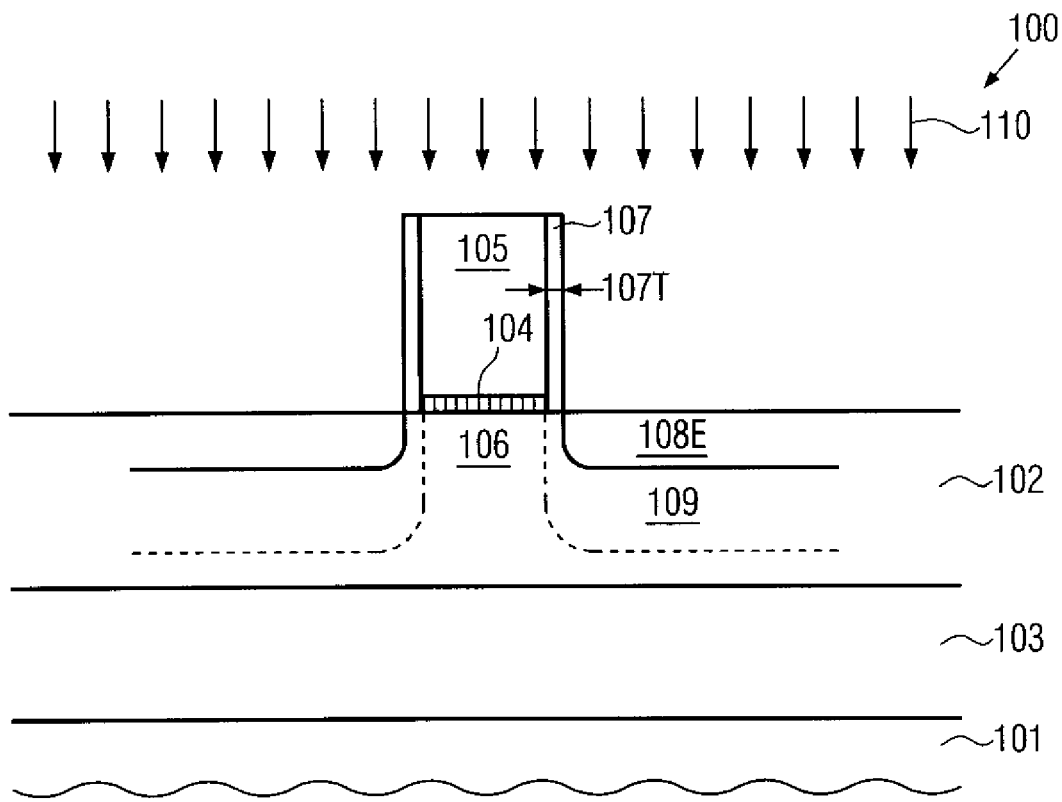

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 1B:
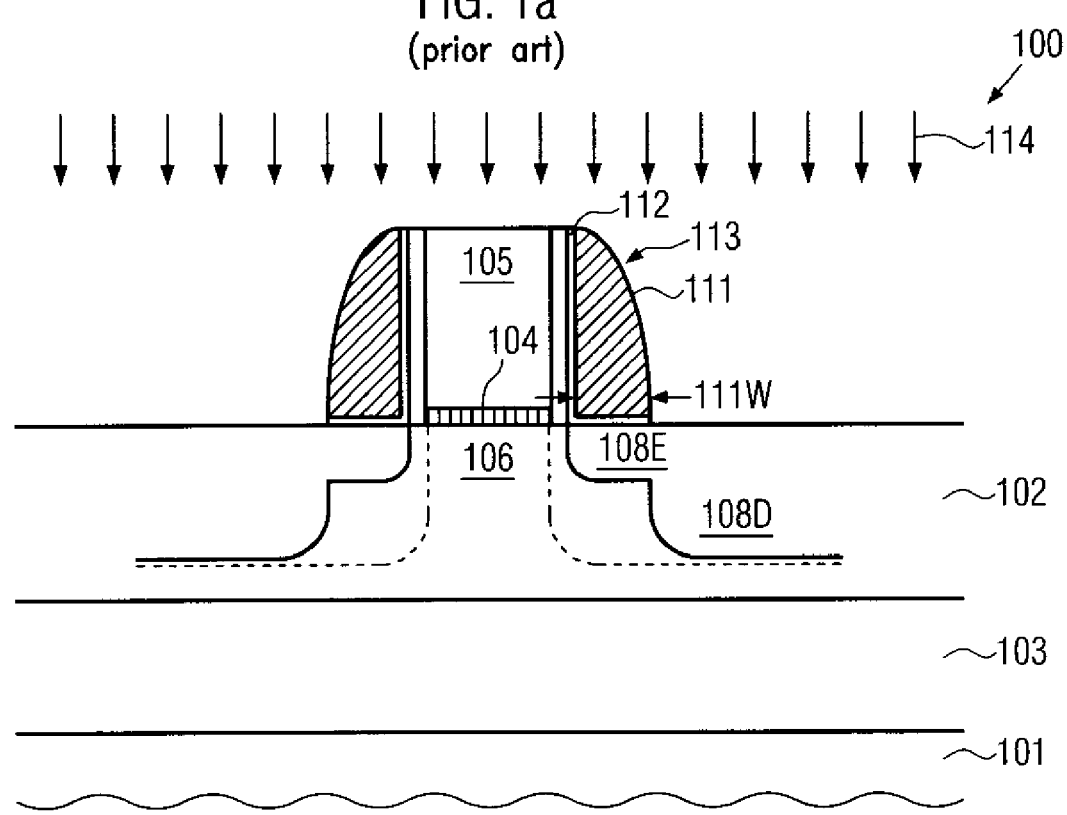

The subject matter disclosed herein generally relates to a manufacturing technique for forming advanced transistor elements with critical dimensions of, for example, 100 nm and significantly less, in which the transistor performance may be determined by the overall resistance of the conductive path between the drain and source contacts and by the capacitance of the respective body region, when SOI configurations are considered. With respect to the former aspect, the sheet resistance of the extension regions, which form respective PN junctions with the adjacent channel region, in combination with the effective channel length, may play an important role in the overall transistor performance. Consequently, a high dopant concentration may typically be required with appropriately desired dopant gradients at the PN junctions, which may efficiently be adjusted on the basis of well-established anneal processes. According to the principles disclosed herein, the corresponding effective channel length, that is, the degree of overlap between the gate electrode and the respective drain and/or source extension regions, may be designed with respect to enhanced transistor performance irrespective of the vertical dopant profile in the remaining deep drain and source areas. On the other hand, by performing an additional implantation process in combination with an advanced anneal process, the vertical extension of the drain and source regions may be separately adjusted, since the lateral profile may already have been established during the previous anneal process and may be substantially maintained due to the advanced short time anneal process, which may result in an additional enhanced activation in the extension regions, thereby reducing the sheet resistance thereof. With respect to the latter aspect, the additional implant process may, in some illustrative embodiments, be designed such that the respective dopant concentration extends down to a buried insulating layer of an SOI device, since, in this case, any restrictions with respect to a penetration depth during the implant process, as is for instance the case in the conventional strategy as previously explained with reference to FIGS. 1a-1c, in which a certain amount of substantially crystalline material has to be maintained, may no longer be relevant, since activation and re-crystallization may already have been accomplished during the previously performed anneal process. Hence, a corresponding implantation-induced damage resulting from the additional implantation process may be efficiently re-crystallized on the basis of the advanced anneal process due to the presence of the surrounding substantially crystalline material. Consequently, the effective surface area available for forming the PN junction may be significantly reduced since the drain and source regions may be bordered in the depth direction by the insulating layer. Therefore, a reduction of the overall capacitance of the SOI transistor body may be achieved. Hence, a reduced series resistance in combination with a reduced parasitic capacitance may result in increased transistor performance, wherein, additionally, the overall lateral dimensions in the transistor length direction may be reduced due to a reduced spacer width that may be used during the patterning of the lateral dopant profile for the drain and source regions.

As will be explained later on, in some illustrative embodiments disclosed herein, the additional implant step, in combination with the anneal process, may also be efficiently combined with efficient patterning regimes so as to locally vary the optical response of certain device areas to the radiation-based anneal process, thereby providing the potential for selectively annealing respective transistor elements. In this case, a high degree of flexibility in individually adapting the respective transistor characteristics may be achieved, since a respective effective channel length and/or the corresponding spacer width and the like may be individually selected so as to obtain the desired transistor performance.

It should be appreciated that the principles disclosed herein are highly advantageous in the context of semiconductor devices including transistor elements having a gate length of approximately 50 nm and less, since here pronounced dopant profiles at the PN junctions are required, while the degree of dopant activation may also be an important aspect with respect to the reduction of the overall series resistance of the transistor. The techniques disclosed herein may nevertheless also be efficiently applied to less critical semiconductor devices, thereby providing reduced yield losses and enhanced device uniformity. Consequently, the present disclosure should not be considered as being restricted to specific device dimensions unless such restrictions are explicitly set forth in the description or the appended claims. With reference to FIGS. 2a-2e and 3a-3c, further illustrative embodiments will now be described in more detail.

FIG. 2a schematically illustrates a cross-sectional view of a semiconductor device 200, which, in one illustrative embodiment, may represent a field effect transistor. The device 200 may comprise a substrate 201 having formed thereabove a semiconductor layer 202, such as a silicon-based semiconductor layer, which is to be understood as a semiconductor material comprising silicon, possibly in combination with other species, such as germanium, carbon and the like. In other cases, the semiconductor layer 202 may be comprised of any other appropriate semiconductor material, such as germanium, II-VI, III-V semiconductor compounds and the like. In one illustrative embodiment, a buried insulating layer 203 may be provided between the substrate 201 and the semiconductor layer 202, thereby defining an SOI configuration, wherein the buried insulating layer 203 may be comprised of any appropriate dielectric material, such as silicon dioxide, silicon nitride and the like. In other illustrative embodiments, the semiconductor device 200 may represent a "bulk" configuration, in which the semiconductor layer 202 may have a thickness that is significantly greater than the vertical depth of any circuit element formed therein so that a common semiconductor body may be provided for a large number of circuit elements.

In this respect, it should be appreciated that statements with respect to the position of any features of the semiconductor device 200 are to be considered as relative positional information, wherein the substrate 201 or the buried insulating layer 203 or a respective well-defined surface or interface may represent a corresponding reference. That is, terms such as "above," "over," "on" and other similar terms may indicate the position with respect to the respective surface or layer, such as the buried layer 203 and/or the substrate 201, in order to indicate that a feature under consideration has a greater distance to the substrate or the buried insulating layer compared to a feature that is located "below" the feature under consideration. For instance, in this sense, the semiconductor layer 202 is formed above the buried insulating layer 203. Similarly, a lateral direction may represent a direction that extends substantially parallel to the buried insulating layer 203 or any interface formed with the substrate 201. Hence, lateral directions may be understood as a horizontal direction in FIG. 2a, representing a transistor length direction, and a direction substantially perpendicular to the drawing plane of FIG. 2a, representing a transistor width direction.

The semiconductor device 200 may further comprise a gate electrode 205 formed above the semiconductor layer 202 and separated therefrom by a gate insulation layer 204, wherein the gate electrode 205 may, in some illustrative embodiments, have a length of approximately 50 nm and less. On sidewalls of the gate electrode 205, an offset spacer 207 may be provided, which may be comprised of any appropriate material, such as silicon dioxide, silicon nitride and the like. It should further be understood that the gate electrode 205 may be provided in the form of an appropriate gate electrode material, such as polysilicon and the like, while, in other illustrative embodiments, the term "gate electrode" may also represent a respective placeholder structure, which may be replaced by any appropriate material in a later manufacturing stage. Moreover, in one illustrative embodiment, a substantially amorphized portion 209 may be formed in the semiconductor layer 202 adjacent to the gate electrode 205 including the offset spacer 207. A vertical extension of the substantially amorphized portion 209 may be less critical compared to conventional devices, as for instance shown in FIG. 1a, since respective implantation processes for defining the lateral shape of the respective drain and source regions may be performed with reduced penetration depth, as will be explained later on. Consequently, for a given design dimension of the transistor 200, that is, for a target effective channel length, the vertical extension of the substantially amorphized portion 209 may be selected less compared to a conventional process strategy, as previously explained with reference to FIGS. 1a-1c. For instance, the region 209 may extend to approximately half the thickness of the semiconductor layer 202. In this case, a respective implantation process may be performed on the basis of a reduced implantation energy. Moreover, an extension region 208E may be defined in the substantially amorphized portion 209, if provided, wherein a corresponding offset of the extension regions 208E from a corresponding channel region 206 may be defined by a thickness 207T of the offset spacer 207, as is also previously explained with reference to the device 100. However, in the embodiments disclosed herein, the thickness 207T may be selected with respect to obtaining a desired effective channel length and to provide a desired shielding effect during a corresponding implantation process 210 for defining the extension regions 208E and also for forming the substantially amorphized portion 209. That is, a certain minimum thickness 207T may be desired to reduce undue damage at edges of the gate insulation layer 204. Consequently, for otherwise identical design dimensions, the thickness 207T may be less compared to the thickness 107T as previously explained, such as 30-80%, wherein the corresponding anneal parameters for a subsequent anneal process may be appropriately selected to provide the desired diffusion activity to obtain the target channel length.

The semiconductor device 200 as shown in FIG. 2a may be formed on the basis of substantially the same processes as previously described with respect to the device 100, wherein, however, the selection of the design thickness for the offset spacer 207 may be based on different requirements, thereby allowing reduction of the overall lateral dimensions of the transistor 200 while at the same time enhancing the performance thereof. For instance, by using a reduced width 207T, an increased dopant concentration may be obtained for the same effective channel length and the same implantation dose compared to an increased spacer thickness used in a conventional process flow, thereby enhancing the series resistance of the extension region 208E for otherwise identical design dimensions and implantation parameters of the process 210.

Figure 2B:
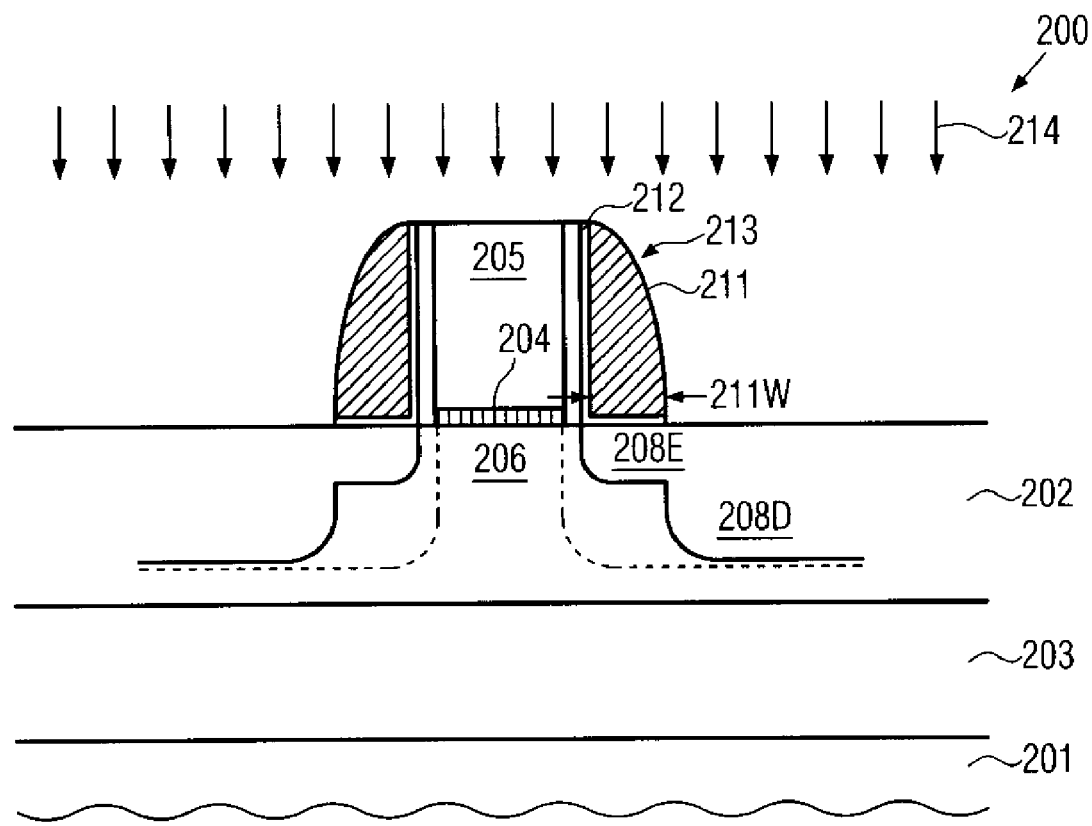

FIG. 2b schematically illustrates the transistor 200 in a further advanced manufacturing stage. As shown, a spacer structure 213 may comprise one or more additional spacer elements 211, for instance in combination with a liner material 212, thereby defining an overall spacer width defined by the width 211W, the thickness of the liner 212 and the thickness 207T. Furthermore, the device 200 is subjected to a further implantation process 214, which, in combination with the implantation process 210, may define the lateral profile of respective drain and source regions 208 prior to actually adjusting the effective channel length on the basis of the extension regions 208E. Thus, in this stage, "deep" drain and source portions 208D may be provided, which may extend to a specified depth. For instance the portions 208D may be within the substantially amorphized portion 209. It should be appreciated that the extension of the regions 208D in the depth direction is less critical, since the finally desired vertical extension of the drain and source regions 208 may be defined on the basis of a further implantation step, as will be described later on. In some illustrative embodiments, the vertical extension of the regions 208D may be less compared to a conventional device having substantially the same design dimensions, thereby providing a desired high dopant concentration in the regions 208D with a reduced implantation dose, which may compensate to a certain degree for an additional implantation time required in a subsequent implantation process. For example, the regions 208D may extend to approximately half the thickness of the semiconductor layer 202, while it should be appreciated that any other depth may be selected as long as a sufficient amount of template material is maintained below the region 208D.

Figure 2C:
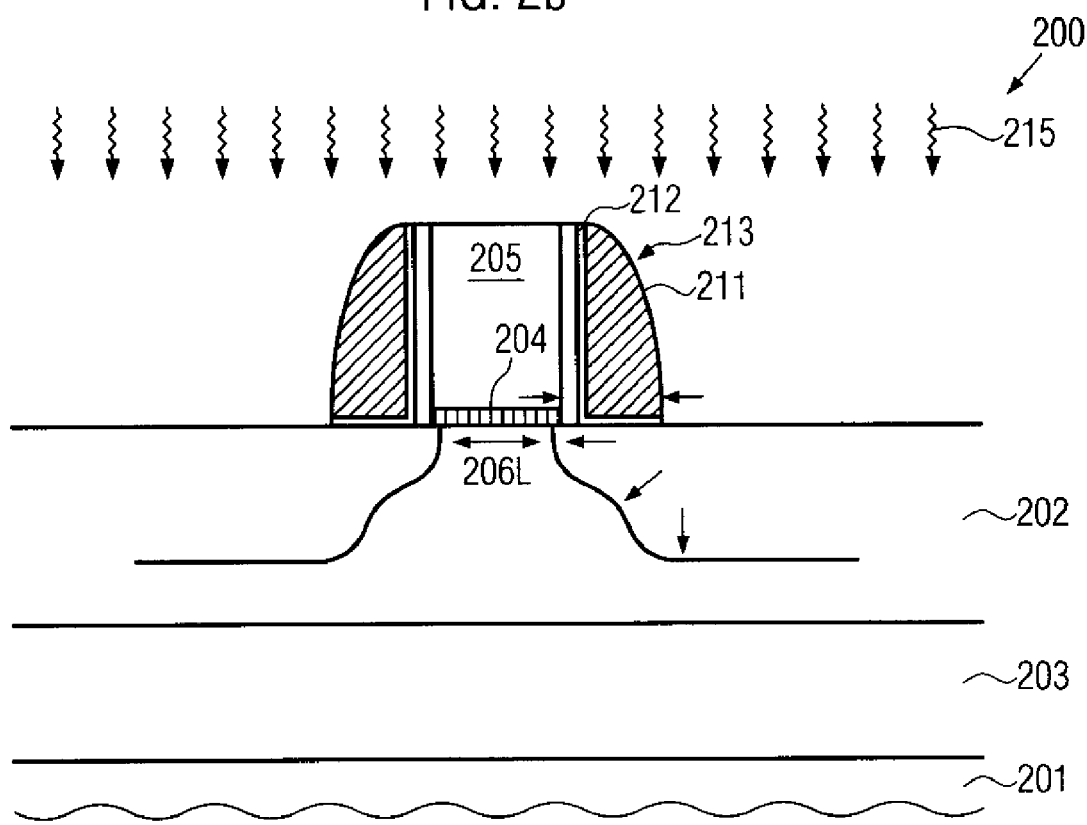

FIG. 2c schematically illustrates the semiconductor device 200 during an anneal process 215, which may represent any well-established conventional RTA process or any other radiation-based process performed on appropriate process parameters in order to obtain a desired degree of diffusion activity. Respective process parameters may readily be established on the basis of available process recipes, experimental data, simulations and the like. For example, by selecting a reduced thickness 207T for the offset spacer 207, the required averaged dopant migration may be reduced compared to conventional strategies, in which the vertical extension of the respective drain and source regions may also have to be adjusted. As a consequence, an overall increased dopant concentration and a steeper gradient at the PN junctions may be achieved, while nevertheless providing the potential for sensitively adjusting the desired overlap between the extension region 208E and the gate electrode 205. In some illustrative embodiments, the process 215 may comprise two or more different types of anneal processes in order to obtain the desired channel length 206L and the high degree of dopant activation and re-crystallization. For instance, the process 215 may comprise a heat treatment on the basis of moderately low temperatures of approximately 500-800° C., at which a significant dopant diffusion may be moderately low. In this case, an efficient re-crystallization may be obtained, wherein effectively dopant atoms may also be positioned at lattice sites. In other cases, a moderately high temperature may be applied to provide the desired dopant diffusion, wherein, prior to or after the application of the moderately high temperature, for instance, in the range of approximately 900-1100° C., a radiation-based anneal process may be performed in order to further enhance the dopant activation while substantially not affecting any further dopant diffusion by correspondingly restricting the respective irradiation time. Hence, after the anneal process 215, a moderately high degree of dopant activation may be achieved and implantation-induced damage may be substantially re-crystallized, in particular when the substantially amorphized portion 209 may be provided. Moreover, the channel length 206L may be adjusted to a respective target value.

Figure 2D:
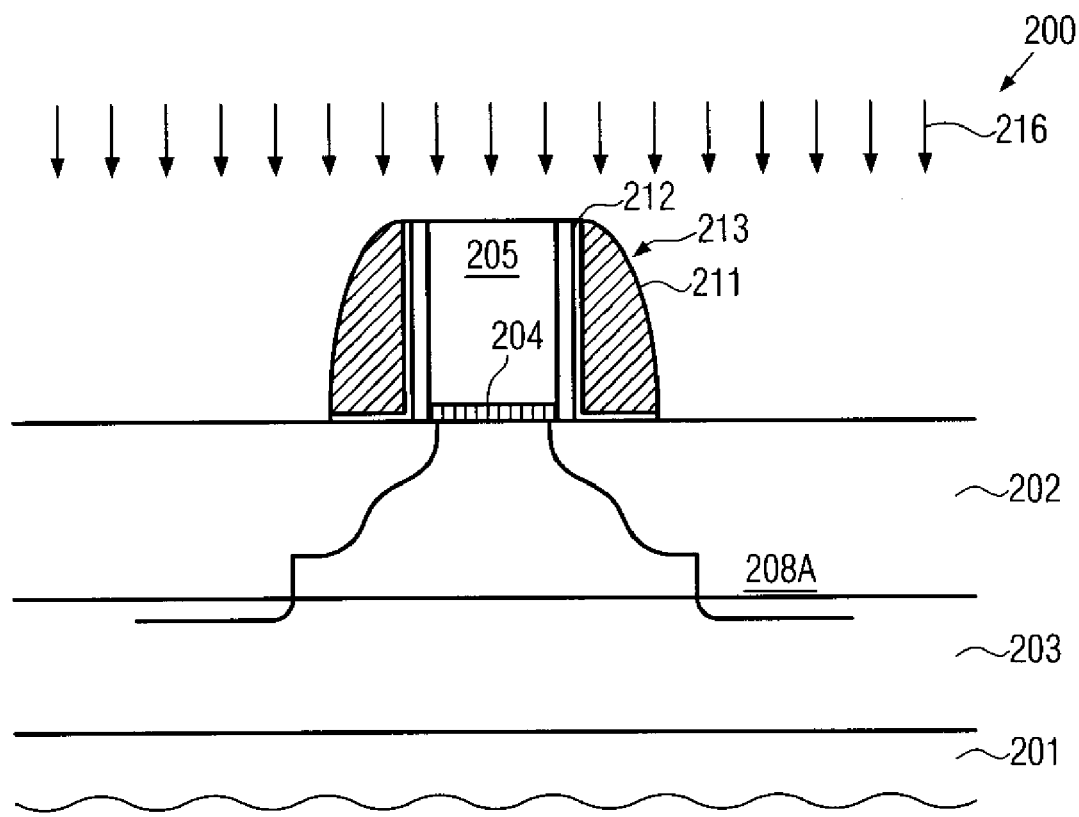

FIG. 2d schematically illustrates the transistor 200 when subjected to a further implantation process 216 in order to introduce further dopant material into the semiconductor layer, which, in the illustrative embodiment shown, may be accomplished on the basis of the same spacer structure 213 as has also been used during the implantation 214. The process parameters of the implantation process 216 may be selected such that a desired average penetration depth may be obtained so as to adjust the finally desired vertical extension of the drain and source regions 208. The dopant species introduced during the process 216 has the same conductivity type as the dopants used for defining the regions 208E, 208D, wherein, however, the same or a different species may be used. For instance, a lighter dopant species may be in some illustrative embodiments to reduce an implantation-induced damage during the process 216. In other cases, the process 216 may be performed using the same dopant species as in one or both of the implantation processes 210, 214. In one illustrative embodiment, an additional implant region 208A may be formed by the process 216, which may extend down to the buried insulating layer 203, wherein it should be appreciated that, in this case, dopant material may also be introduced into the buried insulating layer 203. During the implantation 216, respective lattice damage may be created, wherein, however, a respective template material may nevertheless be provided adjacent to the region 208A, for instance in the form of non-damaged portions of the region 208D. Furthermore, the implantation 216 may be performed on the basis of a lower implantation dose compared to the implantation process 214, thereby also reducing the degree of implantation-induced damage, while nevertheless obtaining a significantly higher concentration compared to conventional strategies when using a diffusion mechanism to drive a respective dopant species down to the buried insulating layer 203.

In other illustrative embodiments, the implantation process 216 may be performed on the basis of a modified spacer structure 213, for instance by removing a portion of the spacer element 211 or by providing additional material, for instance depositing a respective spacer layer having a desired thickness (not shown), which may be patterned on the basis of an anisotropic etch process or which may be maintained in a non-patterned manner during the implantation process 216. In some illustrative embodiments, the gate electrode 205 may receive a cap layer (not shown), when a height of the gate electrode 205 may not be sufficient to appropriately stop the respective dopant species prior to penetrating the gate insulation layer 204. For example, if the thickness of the semiconductor layer 202 and the height of the gate electrode 205 are comparable, the gate electrode 205 may be efficiently covered by a cap material providing sufficient process margin during the process 216.

Figure 2E:
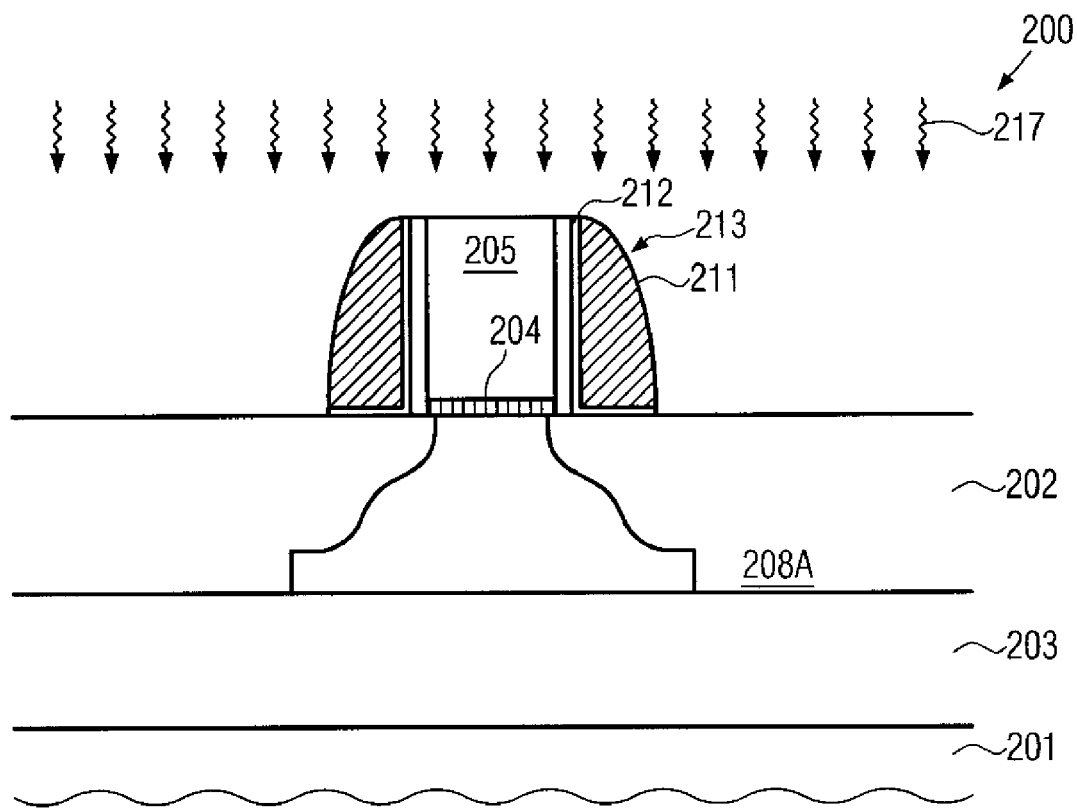

FIG. 2e schematically illustrates the semiconductor device 200 when subjected to a further anneal process 217 in order to activate the dopants in the region 208A substantially without affecting the lateral profile of the drain and source regions 208 and thus substantially not affecting the previously adjusted effective channel length 206L. Thus, the anneal process 217 may be referred to as a substantially diffusion-free anneal process, which may comprise a radiation-based anneal process, in which radiation of a specified wavelength range is directed to specific device positions with a specified energy density and duration. For example, in flash lamp-based anneal processes, light of a specific wavelength range may be directed to specific portions or the entire substrate, wherein the exposure time may be a few milliseconds and even significantly less, such as microseconds and less. In other illustrative radiation-based anneal systems, an appropriate laser source may provide a continuous or pulsed laser beam which may be directed onto a specific device portion by means of an appropriate beam shaping system. That is, depending on the output power of the laser source, the respective beam shaping system may provide a desired specified beam shape and thus size of a corresponding irradiated device portion receiving a respective energy density. Typically, an appropriate scan system may be provided for generating a respective relative movement between the corresponding beam and the substrate 201, wherein the corresponding scan speed may be selected so that a corresponding total exposure time during the anneal process 217 is obtained such that diffusion of dopant atoms may be negligible. During the corresponding irradiation of respective substrate portions, or of the entire substrate, the local temperature in the surface-near area of the substrate 201, i.e., within the gate electrode 205, and the drain and source regions 208 and the buried insulating layer 203, may depend on the energy density, which is selected so as to obtain a high degree of dopant activation while substantially not damaging sensitive device areas, such as the gate insulation layer 204 or the gate electrode 205. Consequently, in the embodiment shown, the respective region 208A extending down to the buried insulating layer 203 may comprise a moderately high concentration of dopant atoms with a high degree of activation, wherein the implantation-induced damage may also be efficiently re-crystallized. Furthermore, the dopants in the extension region 208E and the region 208D may experience a further activation cycle, thereby also enhancing the degree of dopant activation in these areas, which may additionally contribute to a reduced overall resistance in the transistor 200. Consequently, in combination with reducing the dimensions of the transistor 200 in the length dimension due to a reduced spacer width while nevertheless maintaining a desired target channel length 206L, the overall resistance of the transistor 200 may be reduced, while the effective capacitance in the SOI configuration shown in FIGS. 2a-2e may also be reduced, as previously explained.

Furthermore, the process techniques disclosed herein may be highly compatible with additional concepts for enhancing transistor performance. For instance, strain may be created in the channel region 206 in order to enhance the charge carrier mobility therein. Frequently, a highly stressed dielectric material may be formed above the transistor 200 after forming the drain and source regions 208 and providing respective metal silicide regions therein, wherein, in some strategies, prior to forming the respective metal silicide regions, the drain and source regions may be recessed in order to provide the respective stressed material closer to a height level corresponding to the channel region 206. Due to the enhanced degree of dopant activation in the extension regions 208E and also in the region 208D, combined with the fact that the drain and source regions 208 may extend more deeply into the semiconductor layer 202, for instance down to the buried insulating layer 203, a respective recess may be formed to extend more deeply into the semiconductor layer 202 without reducing the overall series resistance compared to conventional strategies. Consequently, in this case, an enhanced overall transistor performance may be obtained due to the enhanced stress transfer mechanism. In other cases, prior to actually defining the drain and source regions, an appropriate semiconductor alloy, such as silicon/germanium, may frequently be incorporated into the drain and source regions, wherein, also in this case, enhanced performance may be achieved by using the sequence described above.

Figure 3A:
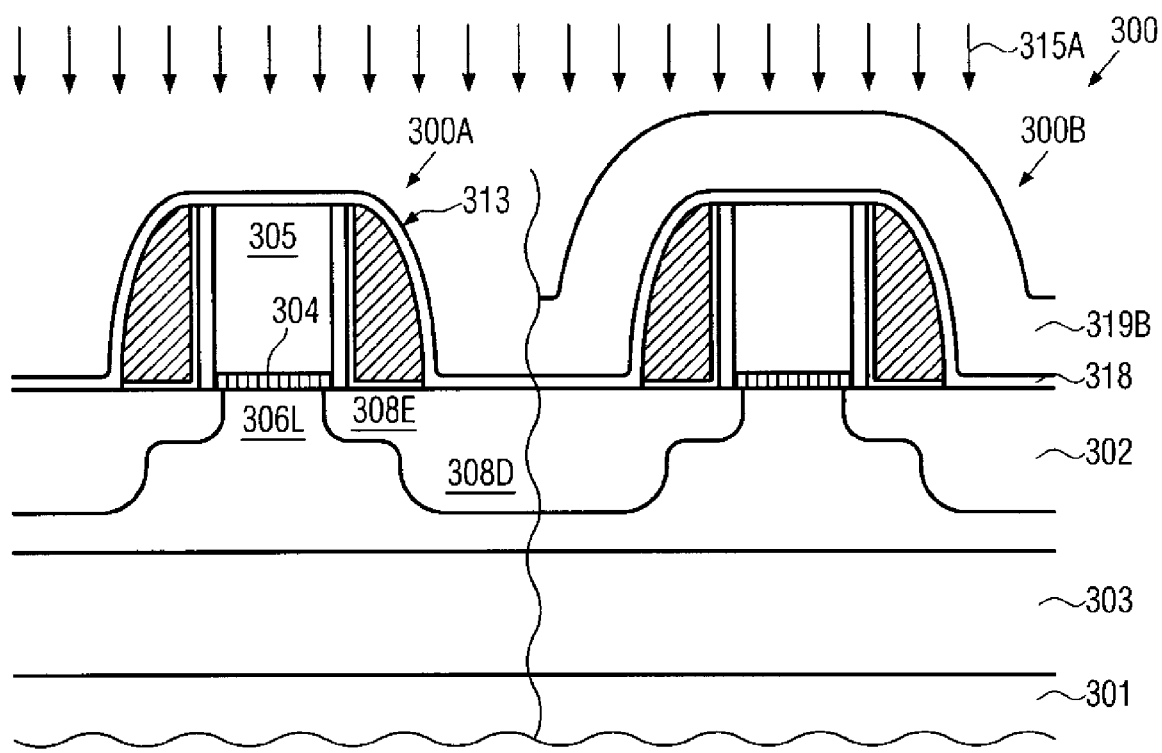
FIGS. 3a-3c schematically illustrate cross-sectional views of a semiconductor device including different transistor elements in which the respective effective channel length may be adjusted independently from a corresponding depth of the drain and source regions while additionally providing the potential for separately adjusting the respective channel lengths according to still further illustrative embodiments.
Figure 3B:
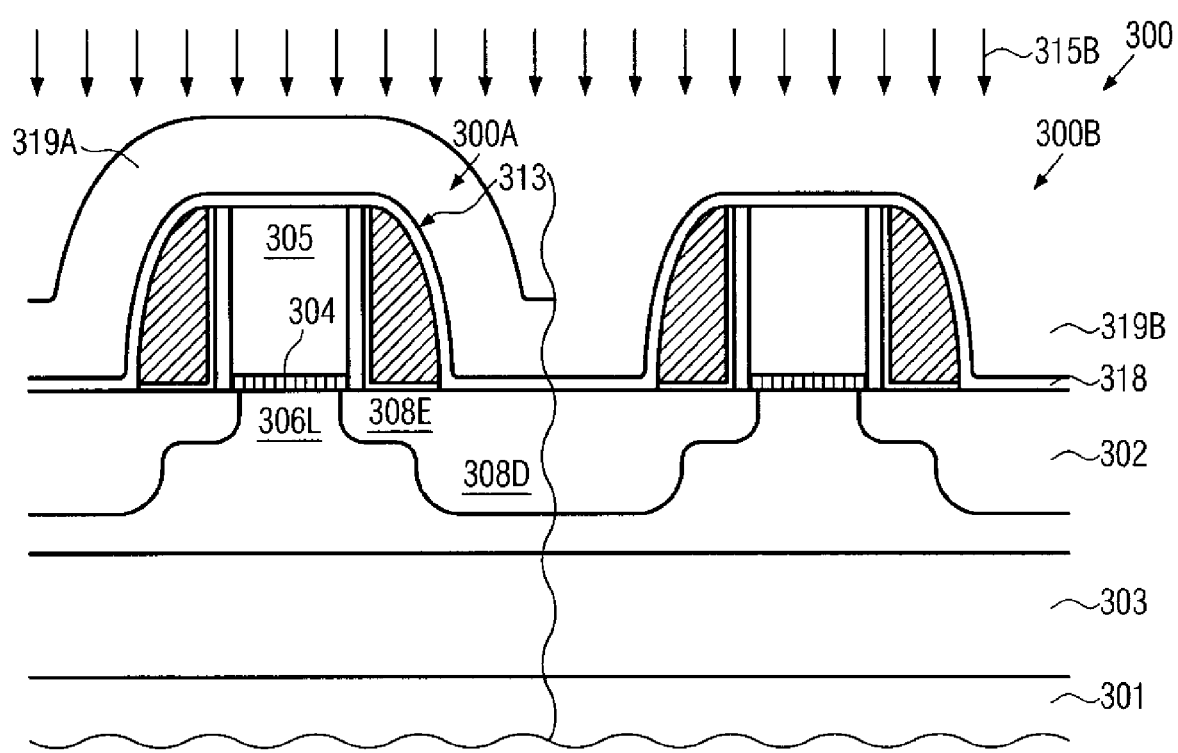
Figure 3C:
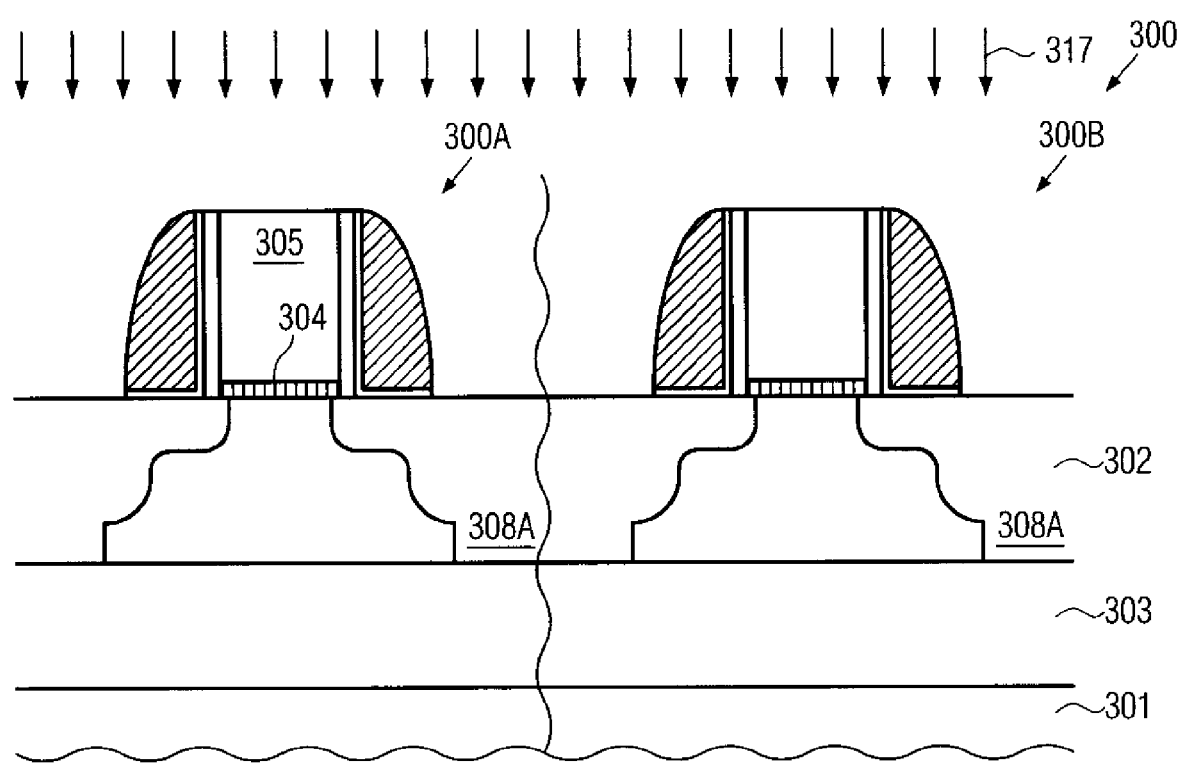

With reference to FIGS. 3a-3c, further illustrative embodiments will now be described in which the concept of a late implantation combined with a substantially diffusion-free anneal process may be advantageously applied to different transistors in order to provide the potential for individually adjusting the corresponding channel length and/or individually adapting the corresponding anneal conditions during the definition of the channel length.

FIG. 3a schematically illustrates a semiconductor device 300 comprising a substrate 301 and a semiconductor layer 302 formed thereabove. Furthermore, in some illustrative embodiments, a buried insulating layer 303 may be provided between the substrate 301 and the semiconductor layer 302. With respect to these components, the same criteria apply as previously explained with reference to the devices 100 and 200. The device 300 may comprise a first transistor 300A and a second transistor 300B, which may differ in their conductivity type and/or in their configuration and the like. For instance, the transistors 300A, 300B may represent an N-type transistor and a P-type transistor, respectively, while, in other cases, the transistors 300A, 300B may have a different configuration, for instance with respect to a spacer structure, the effective channel length and the like. One or both of the transistors 300A, 300B may comprise, in this manufacturing stage, a gate electrode 305 formed on a gate insulation layer 304, which separates a gate electrode 305 from a channel region 306. Furthermore, a spacer structure 313 may be formed on sidewalls of the gate electrode 305, wherein it should be appreciated that the spacer structure 313 in the first and second transistors 300A, 300B may be different with respect to material composition, spacer width and the like. In other cases, the spacer structures 313 may have substantially the same configuration, since they may have been formed in a common manufacturing sequence. Furthermore, respective extension regions 308E and "deep" source and drain regions 308D may be provided within the semiconductor layer 302. Furthermore, the device 300 may comprise, in this manufacturing stage, a protection layer 319B formed above the second transistor 300B in order to "pattern" the optical response of the transistors 300A, 300B with respect to a radiation-based anneal process 315A designed to adjust the desired channel length 306L in the first transistor 300A on the basis of a corresponding diffusion activity. Furthermore, an etch stop layer 318 may be provided, which may have a high etch selectivity with respect to the material of the protection layer 319B, in order to enhance the patterning of the layer 319B. In other cases, the etch stop layer 318 may be omitted when a sufficiently high etch selectivity exists for material of the layer 319B with respect to the materials used in the first and second transistors 300A, 300B. For example, the protection layer 319B may be comprised of silicon nitride, silicon oxynitride and the like, while the etch stop layer 318 may be comprised of silicon dioxide. In other cases, the protection layer 319B may comprise silicon dioxide, silicon oxynitride and the like, while the layer 318 may comprise silicon nitride, silicon carbide and the like.

The semiconductor device 300 as shown in FIG. 3a may be formed on the basis of similar process techniques as previously described with respect to the device 200 and 100, wherein, in some illustrative embodiments, the spacer structures 313 may be formed in a common manufacturing sequence, thereby reducing process complexity, while, in other illustrative embodiments, the spacer structures 313 may be individually adapted to the specific device requirements of the first and second transistors 300A, 300B, respectively. For example, the respective implantation processes for defining the regions 308E and 308D may be performed for one transistor, for instance the transistor 300A, wherein an appropriately designed spacer structure 313 may be used, while, during this sequence, the transistor 300B may be covered by a corresponding mask material (not shown). Thereafter, the mask material may be removed and a corresponding sequence may be performed for the transistor 300B, that is, a respective spacer structure 313 may be formed and a respective implantation sequence may be used.

In other illustrative embodiments, the anneal process 315A may be performed for the transistor 300A, while the transistor 300B is still covered by the mask material and thus may not have formed therein the spacer structure 313 and the regions 308E, 308D. Also, in this case, the respective process parameters of the process 315A may be selected so as to individually obtain the desired channel length 306L in the first transistor 300A. In the embodiment shown in FIG. 3a, the process 315A may be performed after having formed the respective spacer structures 313 and the regions 308E, 308D on the basis of a process strategy previously explained with reference to the device 200. Thereafter, the etch stop layer 318, if provided, may be deposited, followed by the deposition of the protection layer 319B, which may have optical characteristics so as to significantly reduce the energy deposition in the second transistor 300B. For instance, the protection layer 319B may be designed as a highly reflective layer, for instance comprising a plurality of appropriately designed sub-layers, for instance on the basis of silicon nitride, silicon oxynitride and the like, while, in other cases, a highly reflective material may be provided, at least at a surface portion of the layer 319B. For example, a refractory metal may be formed at a surface portion of the layer 319. Consequently, the second transistor 300B may be effectively shielded against the radiation of the process 315A, thereby resulting in a desired diffusion in the first transistor 300A, while substantially maintaining the dopant profile in the second transistor 300B, if provided in this manufacturing stage.

FIG. 3b schematically illustrates the semiconductor device 300 in a further advanced manufacturing stage. As shown, the protection layer 319B may be removed and a protection layer 319A may cover the first transistor 300A, while exposing the second transistor 300B. Furthermore, a further radiation-based anneal process 315B may be performed on the basis of appropriate process parameters so as to obtain a respective diffusion activity in order to adjust the channel length 306L in the second transistor 300B in accordance with device requirements. For instance, the transistor 300A, 300B may be formed on the basis of very different dopant species, such as N-type and P-type species, which may also exhibit a significantly different diffusion behavior. In this case, the processes 315A, 315B may be specifically adapted to the specific diffusion behavior of these dopant species. As explained above, the protection layer 319A may efficiently shield the first transistor 300A, thereby reducing any energy deposition therein so that the previously established channel length 306L may be substantially maintained. Consequently, the lateral dopant profile in the transistor 300A and 300B may be individually adjusted on the basis of individually designed spacer structures 313, as previously explained, or on the basis of a commonly formed spacer structure, thereby enabling a transistor type specific adaptation of the lateral dopant profile.

FIG. 3c schematically illustrates the semiconductor device 300 in a further advanced manufacturing stage. As shown, respective additional implant regions 308A may be formed in the first and second transistors 300A, 300B, wherein the previously provided spacer structures 313 may have been used as an implantation mask, as previously explained. In the embodiment shown, the respective additional implant regions 308A may extend down to the buried insulating layer 303. Furthermore, the device 300 is subjected to a substantially diffusion-free anneal process 317, thereby obtaining a high degree of dopant activation in the previously activated regions 308E, 308D while also activating and re-crystallizing the additional implant regions 308A. Since the anneal process 317 may not substantially contribute to additional diffusion activity, the process 317 may be performed concurrently for the first and second transistors 300A, 300B, irrespective of the diffusion behavior of the respective dopant species. However, in other cases, the process 317 may be performed at any appropriate manufacturing stage after providing the additional implant regions 308A in one of the transistors, for instance in the transistor 300A. In this case, for example, the process 317 may be performed prior to actually forming a spacer structure and/or an extension region in the other transistor 300B. However, other process strategies may be employed as long as the activation of the regions 308A may not affect the previously adjusted channel length 306L.

As a result, the subject matter disclosed herein provides enhanced transistor performance due to a reduced resistance of the drain and source regions, possibly in combination with a reduced parasitic capacitance in SOI transistors, which may be accomplished by defining the lateral profile of the respective drain and source regions on the basis of a specifically designed anneal process and defining the finally desired vertical extension of the drain and source regions by an additional deep implantation process followed by a substantially diffusion-free anneal process. In SOI transistors, the drain and source regions may readily be driven down to the buried insulating layer with a moderately high dopant concentration, wherein the subsequent substantially diffusion-free anneal process provides enhanced dopant activation in the extension region while substantially maintaining the desired effective channel length. Furthermore, a respective lateral dimension of the transistors in the length direction may be reduced for a given effective channel length by reducing the respective spacer width used for laterally profiling the drain and source regions.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

performing a first implantation process to introduce a first dopant species of a first conductivity type into a semiconductor region to form drain and source extension regions adjacent a gate electrode;

performing a second implantation process to introduce said first dopant species into said semiconductor region to form a first portion of drain and source regions deeper than said drain and source extension regions by using said gate electrode and a spacer structure formed on sidewalls thereof to mask said second implantation process;

performing a first anneal process for activating said first dopant species and substantially adjusting an effective channel length of a transistor defined by said gate electrode and said semiconductor region;

after performing the first anneal process, performing a third implantation process to introduce a second dopant species of said first conductivity type into said semiconductor region to form a second portion of said drain and source regions deeper than said first portion by using said gate electrode and said spacer structure to mask said third implantation process, wherein said third implantation process is performed using the same spacer structure used to perform said second implantation process; and performing a second anneal process for activating said first and second dopant species.

2. The method of claim 1, wherein a duration of said first anneal process is longer than that of said second anneal process.

3. The method of claim 1, wherein performing said first anneal process comprises controlling at least one process parameter so as to obtain a lateral target overlap of said drain and source regions with said gate electrode.

4. The method of claim 1, wherein a duration of said second anneal process is approximately 10 milliseconds or less.

5. The method of claim 1, wherein a buried insulating layer is provided below said semiconductor region, and wherein said third implantation process is controlled to introduce said second dopant species so as to extend to the buried insulating layer.

6. The method of claim 1, wherein said third implantation process is the last implantation process for introducing a dopant species of said first conductivity type for defining said drain and source regions.

7. The method of claim 1, further comprising performing an amorphization implantation process prior to performing said second and third implantation processes.

8. The method of claim 1, wherein performing said first implantation process comprises forming a first spacer element of said spacer structure and performing said first implantation process to define said drain and source extension regions and forming at least a second spacer element of said spacer structure and performing said second implantation process.

9. The method of claim 1, wherein said first and second dopant species are different dopant materials.

10. A method, comprising:
defining drain and source regions and extension regions of a first transistor in a semiconductor layer by performing a plurality of implantation processes for incorporating a first dopant species of a first conductivity type into said semiconductor layer by using a spacer structure formed on sidewalls of a gate electrode, wherein said performing of a plurality of implantation processes further defines a first portion of said drain and source regions deeper than said extension regions;

annealing said drain and source regions of the first transistor to substantially adjust an effective channel length of said first transistor;

introducing a second dopant species of said first conductivity type into said semiconductor layer, said second dopant species extending to a buried insulating layer located below said semiconductor layer to define a second portion of said drain and source region deeper than said first portion, wherein introducing said second dopant species is performed using the same spacer structure used to define said first portion of said drain and source regions as an implantation mask; and activating said second dopant species while substantially maintaining said effective channel length of said first transistor.

11. The method of claim 10, further comprising:
defining drain and source regions of a second transistor in said semiconductor layer by performing a plurality of implantation processes to introduce a third dopant species;

annealing said drain and source regions of the second transistor to substantially adjust an effective channel length of said second transistor;

introducing a fourth dopant species having the same conductivity type as said third dopant species into said semiconductor layer, said fourth dopant species extending to said buried insulating layer located below said semiconductor layer; and activating said third and fourth dopant species while substantially maintaining said effective channel length of the second transistor.

12. The method of claim 11, wherein said channel lengths of said first and second transistors are adjusted in a concurrent anneal process.

13. The method of claim 12, wherein said drain and source regions of the first and second transistors are defined on the basis of said spacer structure of the first transistor and a spacer structure of said second transistor, said spacer structures of the first and second transistors being formed in a concurrent process sequence.

14. The method of claim 12, wherein said drain and source regions of the first and second transistors are defined on the basis of said spacer structure of the first transistor and a spacer structure of said second transistor, said spacer structures of the first and second transistors being formed in different process sequences.

15. The method of claim 11, wherein adjusting said channel lengths of the first and second transistors comprises defining said drain and source regions of the first transistor and selectively annealing said first transistor prior to defining said drain and source regions of said second transistor.

16. The method of claim 11, wherein said first conductivity type differs from the conductivity type of said third and fourth dopant species.

17. The method of claim 10, wherein introducing said second dopant species comprises a last implantation process for defining the drain and source regions of said first transistor.

* * * * *